(12) United States Patent
Hobelsberger et al.

(10) Patent No.: US 9,442,139 B2
(45) Date of Patent: Sep. 13, 2016

(54) ROGOWSKI COIL ASSEMBLY

(71) Applicant: ALSTOM Technology Ltd., Baden (CH)

(72) Inventors: Max Hobelsberger, Wuerenlingen (CH); Dominic Gerber, Dietikon (CH)

(73) Assignee: ALSTOM TECHNOLOGY LTD., Baden (CH)

( * ) Notice: Subject to any disclaimer, the term of this patent is extended or adjusted under 35 U.S.C. 154(b) by 427 days.

(21) Appl. No.: 13/767,045

(22) Filed: Feb. 14, 2013

(65) Prior Publication Data

US 2013/0154616 A1    Jun. 20, 2013

(30) Foreign Application Priority Data

Aug. 20, 2010 (EP) ..................... 10173535

(51) Int. Cl.
*G01R 15/18* (2006.01)

(52) U.S. Cl.
CPC .................. *G01R 15/181* (2013.01)

(58) Field of Classification Search
CPC ............... G01R 15/181; H01F 5/02
USPC .................................. 324/127, 126
See application file for complete search history.

(56) References Cited

U.S. PATENT DOCUMENTS

| | | | |
|---|---|---|---|
| 3,146,417 A | 8/1964 | Pearson | |
| 4,831,295 A * | 5/1989 | Posedel | 310/72 |
| 4,899,103 A | 2/1990 | Katzenstein | |
| 5,489,847 A * | 2/1996 | Nabeshima et al. | 324/318 |
| 5,646,561 A * | 7/1997 | Fanini et al. | 327/110 |
| 6,559,786 B2 * | 5/2003 | Groiss et al. | 341/158 |
| 7,102,379 B2 | 9/2006 | Hobelsberger et al. | |
| 7,649,470 B2 | 1/2010 | Hobelsberger et al. | |
| 7,825,763 B2 | 11/2010 | Dupraz et al. | |
| 2005/0184751 A1 | 8/2005 | Hobelsberger et al. | |
| 2005/0248430 A1* | 11/2005 | Dupraz et al. | 336/200 |
| 2006/0091896 A1 | 5/2006 | Schrom et al. | |
| 2007/0176674 A1* | 8/2007 | Shioda | H03H 3/02 327/559 |
| 2008/0246460 A1* | 10/2008 | Smith | 324/76.11 |
| 2009/0230974 A1 | 9/2009 | Kojovic et al. | |

FOREIGN PATENT DOCUMENTS

| | | |
|---|---|---|
| CN | 1547034 A | 11/2004 |
| CN | 1547035 A | 11/2004 |
| CN | 1570655 A | 1/2005 |
| CN | 1783372 A | 6/2006 |
| GB | 2259150 | 3/1993 |
| GB | 2259150 A * | 3/1993 |

(Continued)

OTHER PUBLICATIONS

"Questions and Answers for the State Examination Commission of the Ogarev Mordovia State University," (Mar. 7, 2008), http://gendocs.ru/v27431/?cc=5. (2 pages).

(Continued)

*Primary Examiner* — Arleen M Vazquez
*Assistant Examiner* — Robert P Alejnikov, Jr.
(74) *Attorney, Agent, or Firm* — Buchanan Ingersoll & Rooney PC (57) ABSTRACT

A Rogowski coil assembly (1) for measurement of high frequency electrical currents includes coil segments (3) disposed in series with retrospective impedance influence reduction coupling.

12 Claims, 8 Drawing Sheets

(56) References Cited

FOREIGN PATENT DOCUMENTS

| KR | 10-2009-0107863 A | 10/2009 |
| --- | --- | --- |
| RU | 8125 U1 | 10/1998 |
| WO | WO98/48287 | 10/1998 |
| WO | WO99/54740 | 10/1999 |
| WO | WO00/72027 | 11/2000 |
| WO | 2004/025811 A2 | 3/2004 |
| WO | WO2006/123320 | 11/2006 |
| WO | WO2007/000062 | 1/2007 |
| WO | WO2012/022779 | 2/2012 |

OTHER PUBLICATIONS

Baocheng et al., "Frequency Response Analysis of a Rogowski Coil Transducer and Its Design Method," Transactions of China Electrotechnical Society, (Sep. 2009), vol. 24, No. 9. pp. 21-27.

Ferkovic et al., "Temperature and Frequency Dependence of Precision Current Transformer Based on Rogowski Coils," XIX IMEKO World Congress Fundamental and Applied Metrology, (Sep. 6-11, 2009), Lisbon, Portugal, pp. 632-637.

Office Action issued on Aug. 20, 2014, by the Russian Patent Office in corresponding Russian Patent Application No. 2013112351, and an English Translation of the Office Action. (15 pages).

First Office Action issued on Aug. 29, 2014, by the State Intellectual Property Office, P.R. China in corresponding Chinese Patent Application No. 201180050642.7, and an English Translation of the Office Action. (31 pages).

Ray, W. F., et al., "High Performance Rogowski Current Transducers," Industry Applications Conference, 2000, pp. 3083-3090, Conference Record of the 2000 IEEE Oct. 8-12, 2000, Piscataway, NJ, US.

Li, W., et al., "The Study of Transient Performance of Current Sensor Based on Rogowski Coil and Its Application in Dynamic Simulation Experiment," Power System Technology 2006, pp. 1-6, Powercon 2006, International Conference on, IEEE, PI.

Search Report for European Patent App. No. 10173535.5 (Feb. 1, 2011).

International Search Report and Written Opinion for PCT Patent App. No. PCT/EP2011/064211 (Nov. 7, 2011).

Office Action (Decision of Grant) issued on Jan. 26, 2015, by the Russian Patent Office in corresponding Russian Patent Application No. 2013112351/28, and an English Translation of the Office Action. (13 pages).

\* cited by examiner

ROGOWSKI COIL ASSEMBLY

This application is a Continuation of, and claims priority under 35 U.S.C. §120 to, International App. No. PCT/EP2011/064211, filed 18 Aug. 2011, and claims priority therethrough under 35 U.S.C. §§119, 365 to European App. No. 10173535.5, filed 20 Aug. 2010, the entireties of both of which are incorporated by reference herein.

BACKGROUND

1. Field of Endeavor

The present invention relates to a Rogowski coil assembly, in particular for use in a current measurement apparatus like a Rogowski sensor, in particular for measuring high frequency electrical currents.

2. Brief Description of the Related Art

Rogowski coils are well known in the art to provide a reliable device for measuring and sensing current flow at a given point in an electrical system.

Its functioning is based on the fact that a current flowing through a conductor generates a magnetic field that, in turn, induces a voltage in the coil. This is based upon Faraday's law stating that "the electromotive force induced in a close circuit is proportional to the time rate of change of the total magnetic flux linking the circuit".

A Rogowski coil is generally fabricated from a conductor that is coiled or wound on a non magnetic core, which may be for example air or a non-magnetic material.

The coil may be placed or bent around a conductor whose currents are to be measured with a coil.

However, a physical problem arises when trying to use a long Rogowski coil for measuring and sensing currents in the MHz range where a large bandwidth is needed.

Indeed, the bandwidth of a Rogowski coil depends on the number of windings, the length and the cross section, whereas the sensitivity depends on the number of windings per length and the cross section.

Therefore, in some applications that need a long Rogowski coil with a large bandwidth, the number of windings per length or the cross section is reduced, leading thus to a lower sensitivity that is not acceptable for some applications.

Some specific attempts have been conducted to overcome this problem.

The document WO 0072027 discloses an electrical current sensor having a quite complex winding scheme in order to reduce the magnetic interference fields and thus achieve good sensitivity at high frequency.

The document WO 98 48287 proposes a device with a wide pass band for measuring electric current intensity in a conductor by using a specific combination of a Rogowski coil and several magnetic field detectors, as for example Hall sensors, where a processor combines all information of the measurement result in order to achieve a relevant response in the high frequency band.

However, due to their complexity and structure, these solutions are not satisfying.

In addition, they do not seem to be adapted when monitoring, for example, shaft currents of electrical machines for fault detection as described in U.S. Pat. No. 7,102,379. Indeed, when spark erosion occurs on the shaft, sharp spikes may be observed in the time signal of the shaft current within a frequency bandwidth of 1.5 MHz to 40 MHz, the shaft being of typically 0.6 to 1.5 m of diameter.

SUMMARY

The present description proposes a simpler and less expensive solution that allows constructing a Rogowski coil of desirable length still having a high sensitivity even in the MHz frequency band.

This is achieved by a Rogowski coil assembly for measurement of high frequency electrical currents comprising coil segments disposed in series with retrospective impedance influence reduction coupling.

Thus, the Rogowski coil assembly is formed by at least two coil segments, the sum of the length of both segments being approximately the total length of the Rogowski coil assembly able to surround a conductor, the current of which should be measured.

The effect of such disposition is that the contribution of each coil segment may be evaluated separately and the segments have each at most small influence on the preceding or subsequent coil segment, whereas the series disposition of the coil segments functions as one Rogowski coil.

Retrospective impedance influence reduction coupling, known in German as "impedanzrückwirkungsmindernde Koppelung", would be defined such that the signal flow is mainly achieved between the input and the output of a segment.

This allows choosing coil segments with high sensitivity and a large bandwidth, the whole Rogowski assembly having a sensitivity and a bandwidth comparable to the sensitivity and bandwidth of the coil segments.

According to one embodiment, the at least two coil segments are connected to each other in series through a signal decoupling circuit, where the output of the one coil segment is connected to the input of the signal decoupling circuit and the input of the subsequent coil segment is connected to the output of the signal decoupling circuit.

According to one aspect, the signal decoupling circuit comprises an impedance converting electrical component with a high input impedance and a low output impedance, where the output of the one coil segment is connected to the input of the impedance converting electrical component and the input of the subsequent coil segment is connected to the output of the impedance converting electrical component.

Thanks to the impedance converting electrical circuit, the influences of the input impedance of a following segment on the output signal of a preceding segment is minimized and therefore allow achieving an important total length of the Rogowski coil assembly while safeguarding high sensitivity and a wide frequency bandwidth.

According to another aspect of the invention, the impedance converting electrical component is an operational amplifier mounted as a voltage follower.

According to another aspect, the input impedance of the impedance converting electrical component is higher or equal to 1 MΩ and the output impedance of the impedance converting electrical component is less or equal to 1Ω.

According to another aspect, the impedance converting component can comprise electrical difference amplifiers with high-impedance inputs and low-impedance outputs.

In one embodiment, the impedance converting electrical component comprises an operational amplifier and two resistances in series as a voltage divider where the operational amplifier and the voltage divider are mounted as a non-inverting amplifier and the output of the coil segment is connected to the non-inverting input of the operational amplifier and the input of the coil segment is connected to the input of the voltage divider.

Therefore, one may take advantage that the individual coil segments comprise electrical amplifiers which amplify the signals generated by the coil(s) of the segment.

According to another embodiment, the signal decoupling circuit comprises a signal converter having an electrical input signal channel and an electrical output signal channel.

As to one aspect, the signal converter comprises at least one optoelectrical converter having an electrical input signal channel and an electrical output signal channel.

As to another aspect, the signal converter comprises a high frequency converter having an electrical input signal channel and an electrical output signal channel.

As to another possibility, the signal converter comprises an A/D-D/A converter.

A person skilled in the art would understand that in these cases, an almost complete electrical decoupling takes place between output of one segment and input of the subsequent segment.

According to another aspect, at least one coil segment comprises a first and a second coil connected in series and wound such that the induced voltages of each coil are added up, the signal decoupling circuit comprises a first and a second operational amplifier, and a fully differential amplifier, one end of the first coil being connected to the non-inverting input of a first operational amplifier having a gain A and the other end of the second coil being connected to the input of the inverting input of the first operational amplifier, the output of the first operational amplifier being connected to the non-inverting input of a fully differential amplifier sensibly of unity gain, the outputs of said fully differential amplifier being the outputs of a coil segment, the inverting input of the fully differential amplifier being connected to the output of a second operational amplifier having unity gain, the non-inverting and inverting inputs of said second operational amplifier being connected to the outputs of a preceding coil segment.

According to a further aspect, the coil segments are wound around a non magnetic core and a return conductor is led through the core.

Furthermore, a low pass filter, in particular a damping resistance, may be connected between the output of one coil segment and the input of the impedance converting electrical component on the one hand and the return conductor on the other hand.

According to another aspect, the core is made of elastic, synthetic, non conducting material, in particular of polyurethane.

According to a further aspect, the core has a hollow centre and a radially oriented longitudinal slit between the hollow centre and the outer periphery of the core.

In addition, the core may be built up of core segments having the same length as the length of the coil segments.

In a further development, the core segments may be mechanically connected to each other through complementary snap fasteners fixed respectively to one core segment and the subsequent core segment.

These snap fasteners are for example made of hard plastic.

According to a further aspect, the impedance converting electrical component is housed in the core.

Alternatively the impedance converting electrical component is housed in the snap fasteners.

The total length of the Rogowski coil assembly may be comprised between 1.75 m and 5 m.

According to one example, one core segment has a core diameter of about 16 mm, a length of about 50 cm and about 50 windings.

Another aspect relates to a current measurement apparatus comprising a Rogowski coil assembly as described above.

Furthermore, yet another aspect relates to a shaft erosion monitoring device for monitoring and/or analysis of electrical machines during operation comprising a current measurement apparatus as described above.

DETAILED DESCRIPTION OF EXEMPLARY EMBODIMENTS

Figure 1:
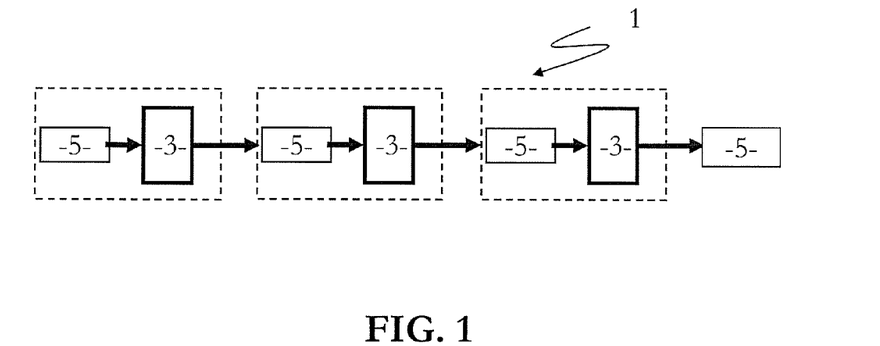
FIG. 1 is a general schematic representation of a Rogowski coil assembly according to a first embodiment.

FIG. 1 is a general schematic representation of a Rogowski coil assembly in particular for measurement of high frequency electrical currents according to a first embodiment.

As can be seen in FIG. 1, the Rogowski coil assembly 1 includes at least two coil segments 3 disposed, at least mechanically, in series. It should be understood that more than two, for example three, or four segments can be assembled, at least mechanically, together in function of the need of length of the perimeter of a conductor around which the Rogowski coil assembly should be bent.

A coil segment can be seen as an individual coil having its input and output. The coil segments fit together as described hereafter, to form the whole Rogowski coil assembly.

These coil segments 3 are not directly connected to each other, but through a retrospective impedance influence reduction coupling. Therefore, the output signal will contain at least the partial contribution of the coil segment 3 for the current measurement.

If at the input of the coil segment 3, an output of the preceding segment is furnished, the response will correspond to the sum of the input and the partial contribution of the coil segment 3.

More in detail, the at least two coil segments 3 are connected to each other in series through a signal decoupling circuit 5 where the output of the one coil segment 3 is connected to the input of the signal decoupling circuit 5 and the input of the subsequent coil segment is connected to the output of the signal decoupling circuit 5.

Figure 2:
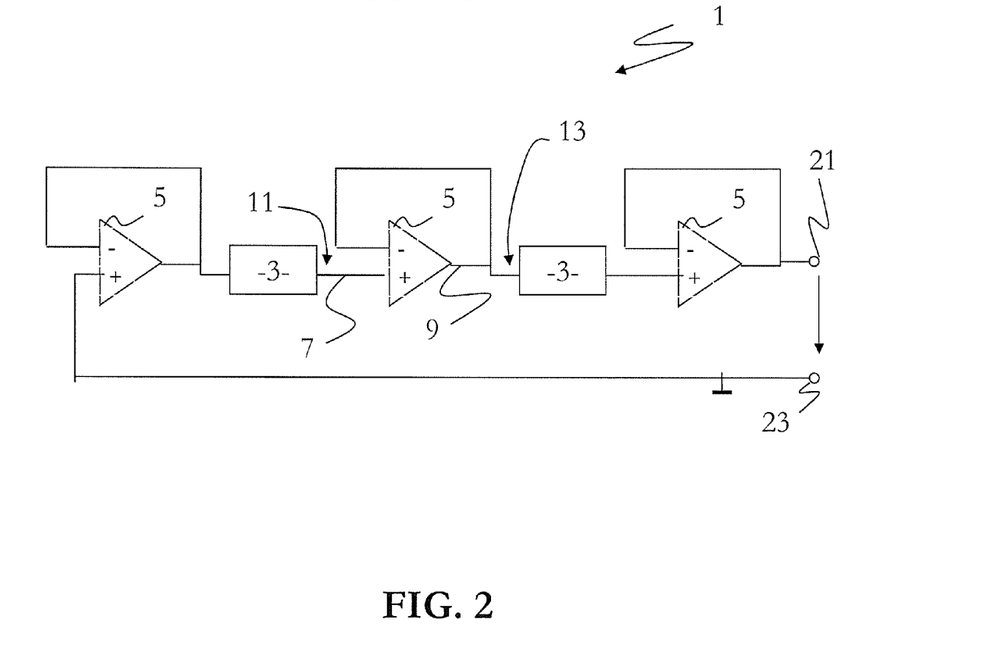
FIG. 2 is an example of an electrical circuit diagram of the Rogowski coil assembly of FIG. 1.

In FIG. 2 is shown an electrical circuit diagram of a Rogowski coil assembly 1 according to a first example As can be seen in FIG. 2, the Rogowski coil assembly 1 includes at least two coil segments 3.

The Rogowski coil segments 3 are connected to each other through a signal decoupling circuit 5.

In this example, the signal decoupling circuit 5 includes an impedance converting electrical component 5 with a high input impedance at input 7 and a low output impedance at the output 9, where the output 11 of the one coil segment 3 is connected to the input 7 of the impedance converting electrical component and the input 13 of the subsequent coil segment 3 is connected to the output 9 of the impedance converting electrical component 5.

For example, input impedance of the impedance converting electrical component 5 is greater than or equal to 1 MΩ and the output impedance of the impedance converting electrical component 5 is less than or equal to 1Ω.

This may be achieved, as shown in FIG. 2, by using an operational amplifier mounted as a voltage follower as an impedance converting electrical component.

Such an assembly allows mounting a Rogowski coil assembly of adaptable length, where bandwidth and sensitivity and measurement precision remain constant.

In such an assembly 1, the influences of the input impedance of a subsequent coil segment with regard to output signals of a preceding coil segment are minimized.

Figure 3:
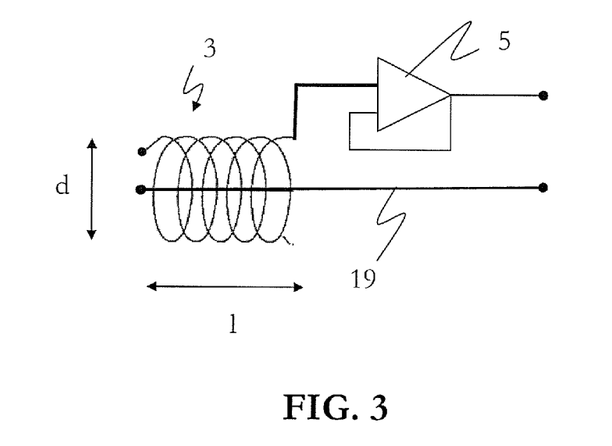
FIG. 3 is a schematic view of a Rogowski coil segment of FIG. 2.

Such a Rogowski coil segment is shown in FIG. 3.

Typically, for one segment, the core diameter d of a Rogowski coil segment 3 is about 16 mm, the length l of about 50 cm, and one segment has about 50 windings (for sake of simplicity, only some windings are represented in FIG. 3).

In addition, in order to reduce outside magnetic field perturbation, a return conductor 19 is lead through the core.

Returning now to FIG. 2, it is also shown that the first and the last Rogowski coil segments are connected to the measurements terminals 21 and 23 through operational amplifiers mounted as a voltage follower and functioning as impedance converting electrical components 5.

Figure 4:
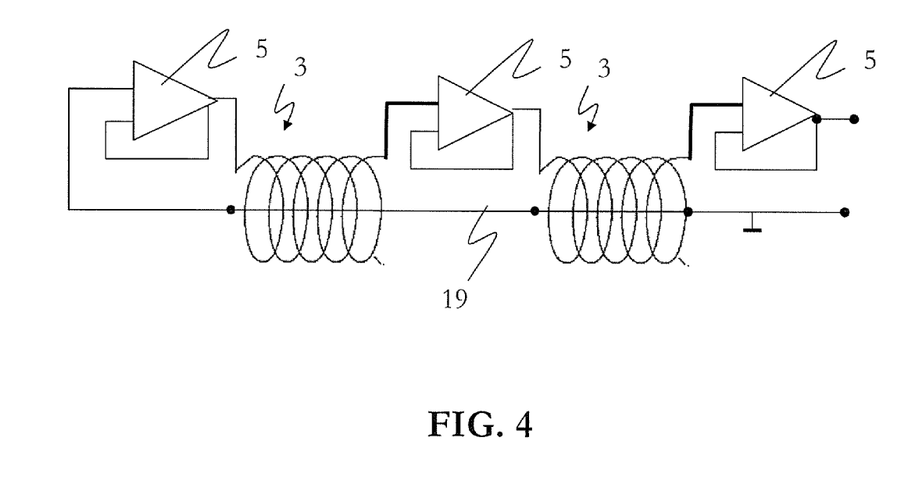
FIG. 4 shows the in series connection of several Rogowski coil segments forming the Rogowski coil assembly.

In FIG. 4 is shown the in-series connection of several Rogowski coil segments forming the Rogowski coil assembly.

The total length of such a Rogowski coil assembly may be between 1.75 m (4 Rogowski coil segments connected together) and 5 m (10 Rogowski coil segments connected together) allowing to thus surround conductors (shafts of an electrical machine) having a diameter of 0.6 m to 1.5 m.

Figure 5:
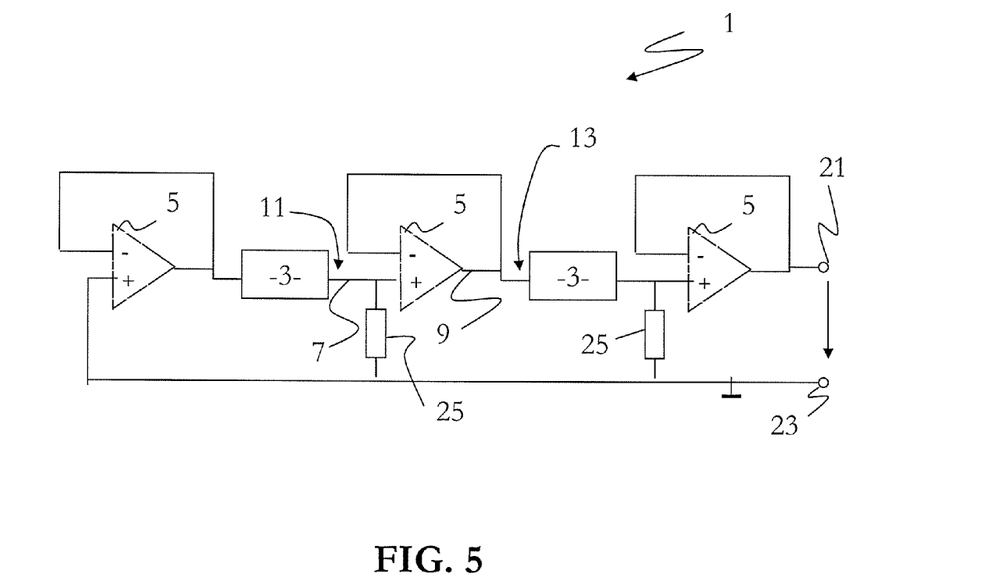
FIG. 5 is an electrical circuit diagram of the Rogowski coil assembly according to another example.

In a further example shown in FIG. 5, which differs from those shown in FIGS. 2 to 4 by a low pass filter 25, in particular a damping resistance Rd, that is connected between the output 11 of one coil segment 3 and the input 7 of the impedance converting electrical component 5 on the one hand and the return conductor 19 on the other hand.

Such a damping resistance can be used for reducing a resonance phenomenon that may arise. Indeed, it may happen, that the sensitivity of the measurement chain rises in an unproportional fashion due to resonance effects, the higher the frequency range in which is located the measurement signal.

Concerning the preceding examples, the output of one coil segment 3 was not amplified.

Figure 6:
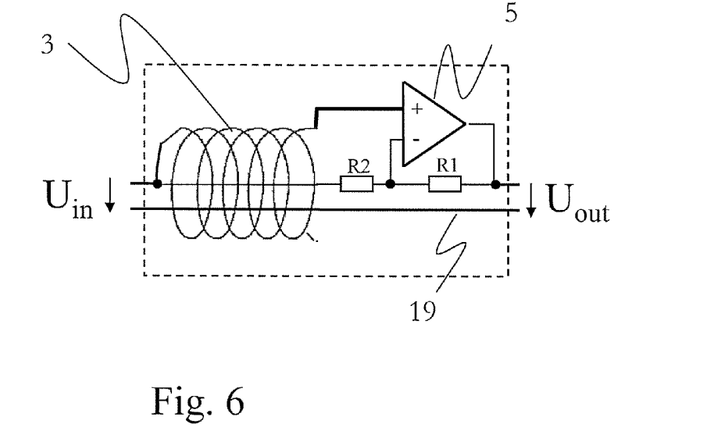
FIG. 6 is a schematic view of a Rogowski coil segment of figure according to a further example.

In FIG. 6 is shown an example of a coil segment with signal amplification.

According to this example, the impedance converting electrical component 5 includes an operational amplifier and two resistances R1, R2 in series as a voltage divider where the operational amplifier and the voltage divider are mounted as a non-inverting amplifier and the output of the coil segment is connected to the non-inverting input of the operational amplifier and the input of the coil segment is connected to the input of the voltage divider R1/R2.

In this case, $U_{in}$ is the input voltage of the Rogowski coil segment 3, in particular the output voltage of a preceding segment 3, and $U_{out}$ is the output voltage of the Rogowski coil segment 3.

In this case, the amplification at the output of the operational amplifier is $$A = (R1 + R2)/R2$$

Figure 7:
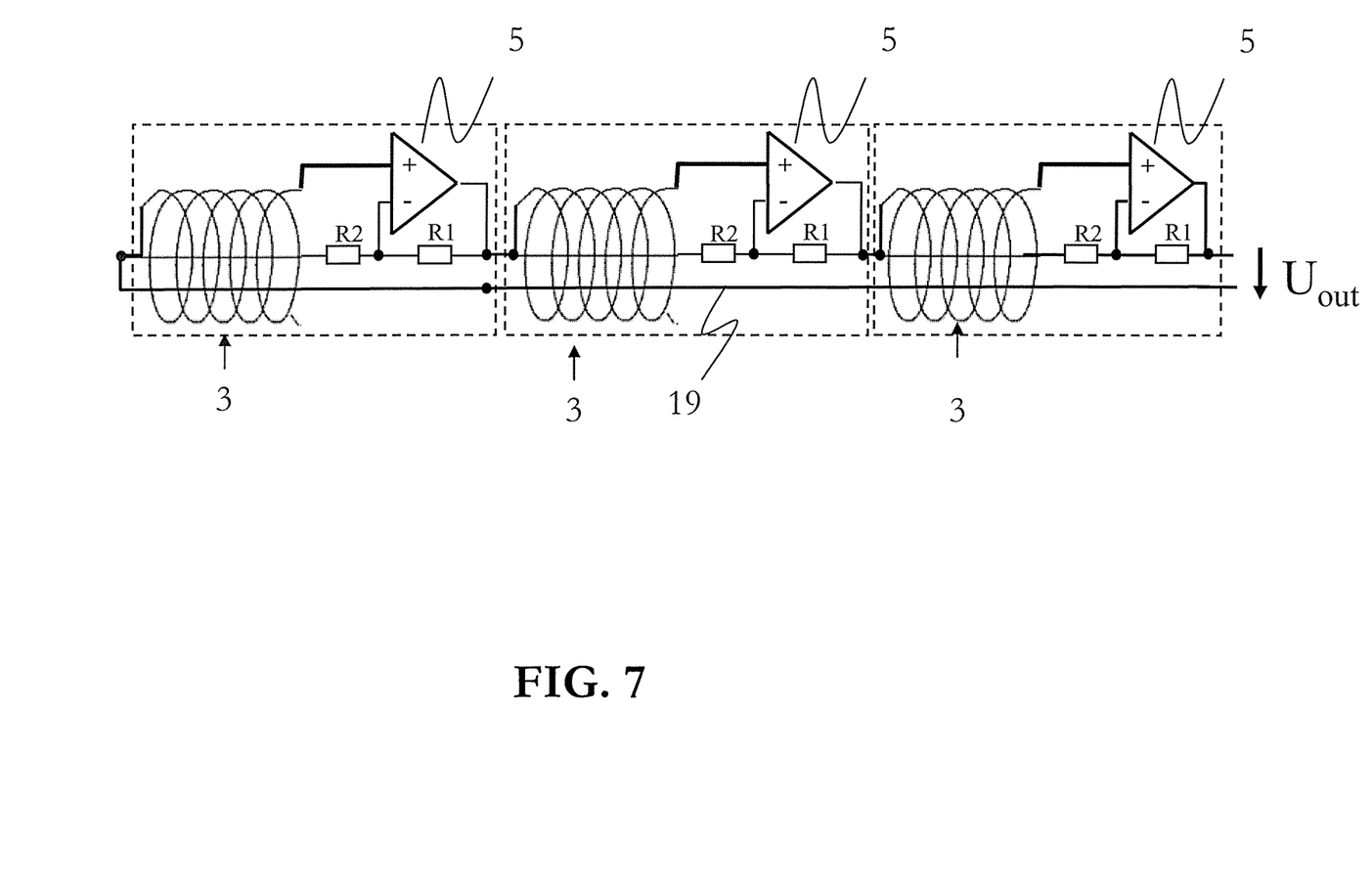
FIG. 7 is an example of an electrical circuit diagram of the Rogowski coil assembly with coil segments according to FIG. 6.

FIG. 7 shows an example of an electrical circuit diagram of the Rogowski coil assembly with three coil segments according to FIG. 6.

$U_{out}$ is the output voltage of the Rogowski coil assembly 1.

Returning now to FIG. 1, the signal decoupling circuit 5 might include, according to a further example, a signal converter having an electrical input signal channel and an electrical output signal channel.

Figure 14:
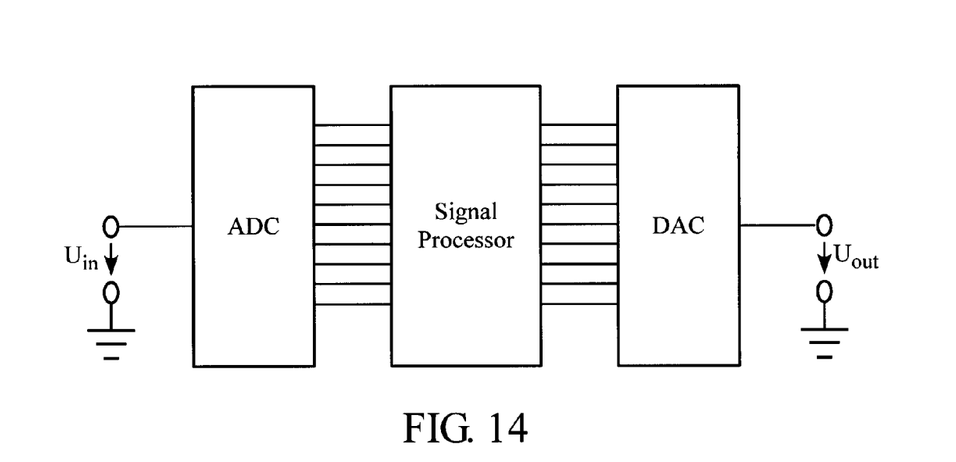
FIG. 14 is an third example of an electrical circuit diagram of another signal converter of the Rogowski coil assembly.

According to one example, the signal converter includes an A/D-D/A converter as illustrated in FIG. 14.

According to another example, the signal converter includes only an A/D converter and the digital results of all coil segments 3 are summed up at distance in a digital processing unit, like a microprocessor.

Figure 13:
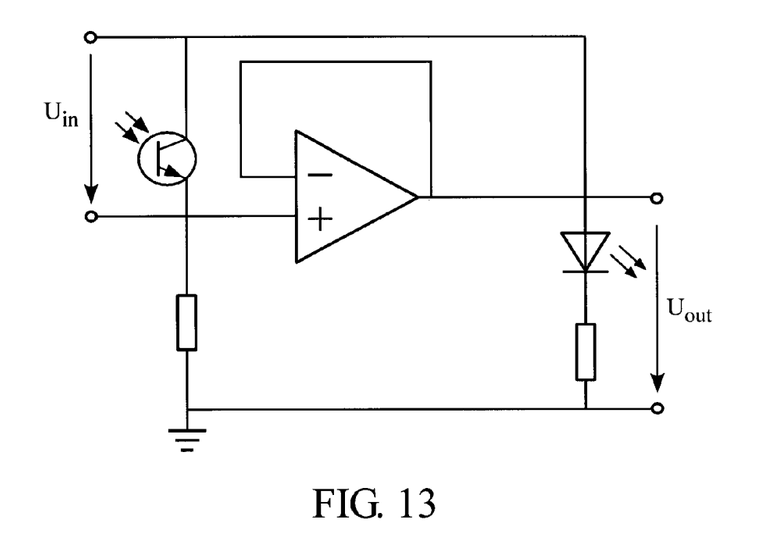
FIG. 13 is a second example of an electrical circuit diagram of a signal converter of the Rogowski coil assembly.

Concerning a further aspect, FIG. 13 is a second example of an electrical circuit diagram of a signal converter of the Rogowski coil assembly. The signal converter includes at least one optoelectrical converter having an electrical input signal channel and an electrical output signal channel. In this case, the electrical signal is converted to an optical signal and then back to an electrical signal.

The conversion from the electrical signal to the optical signal might be directly or through A/D and D/A converters.

In this case, an almost complete electrical decoupling might be achieved.

Figure 15:
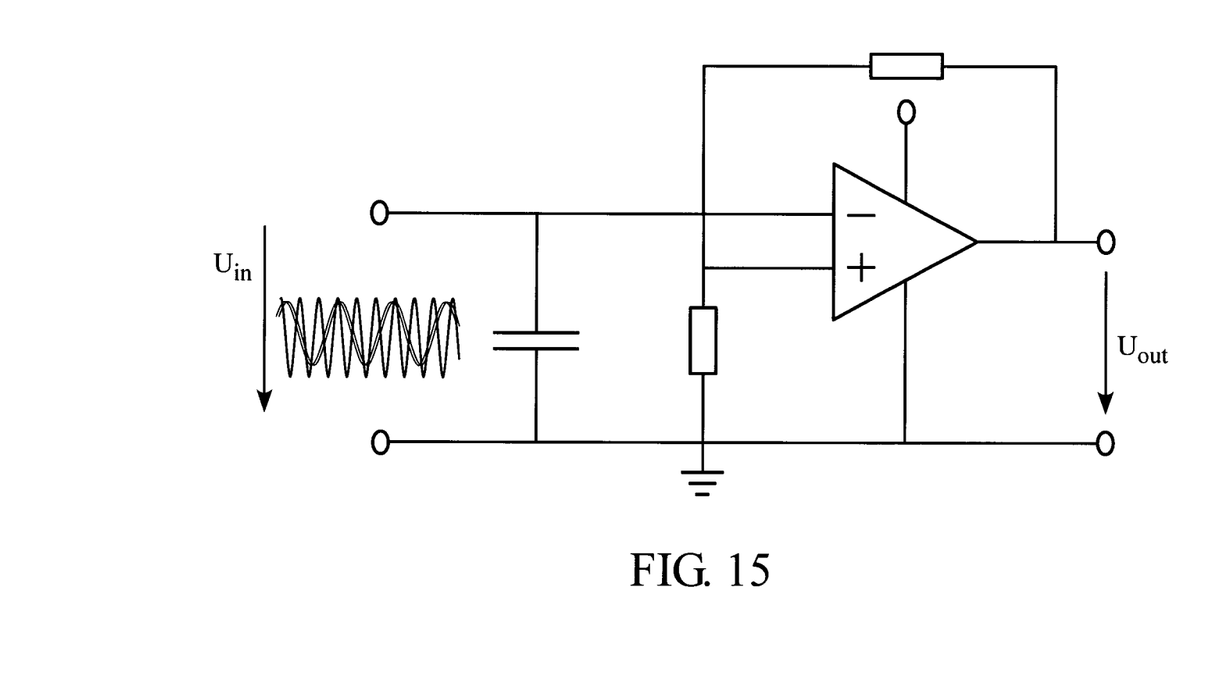
FIG. 15 is a fourth example of an electrical circuit diagram of a signal converter of the Rogowski coil assembly.

According to a further example, the signal converter includes a high frequency converter having an electrical input signal channel and an electrical output signal channel as shown in FIG. 15.

Such a high frequency converter may include a decoupling link with a small HF transformer with, e.g., a ferrite-core used as coupler, which directly transmits the HF-signal received by one coil-segment (and, e.g., power-amplified by an amplifier) to the next coil segment, or it could be a radio-transmission link with, e.g., 1.5 GHz carrier frequency and frequency modulation.

In case of all solutions with signal converters, it should be borne in mind that the signal frequencies involved are up to 5 MHz or more, and therefore a high sampling rate (e.g., 50 MSample/s) would be required, with a resolution of at least 10 bits.

Figure 8:
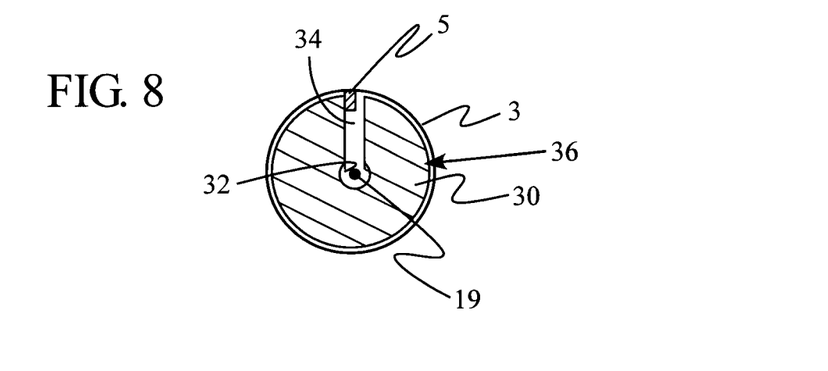
FIG. 8 shows an example of a cross section of a Rogowski coil segment.

In FIG. 8 is shown an example of a cross section of a Rogowski coil segment.

As can be seen in this figure, the coil segment is wounded around a non-magnetic core 30 and the return conductor 19 is lead through the core.

The core is made of elastic, synthetic, non-conducting material, in particular of polyurethane and has a hollow center 32 and a radially oriented longitudinal slit 34 between the hollow center 32 and the outer periphery of the core 36.

The core is built up of core segments having the same length as the length of the coil segments 3.

For ease of mounting of the Rogowski coil assembly, the core segments are mechanically connected to each other through complementary snap fasteners (not illustrated) fixed respectively to one core segment and the subsequent core segment, that may be made of hard plastic.

According to one aspect, the signal decoupling circuit 5 may be housed in the core as shown in FIG. 8.

Alternatively, the signal decoupling circuit 5 may also be housed in the snap fasteners.

The snap fasteners may also include electrical connectors in order to ensure not only mechanical but also electrical connection.

Figures 9, 10:
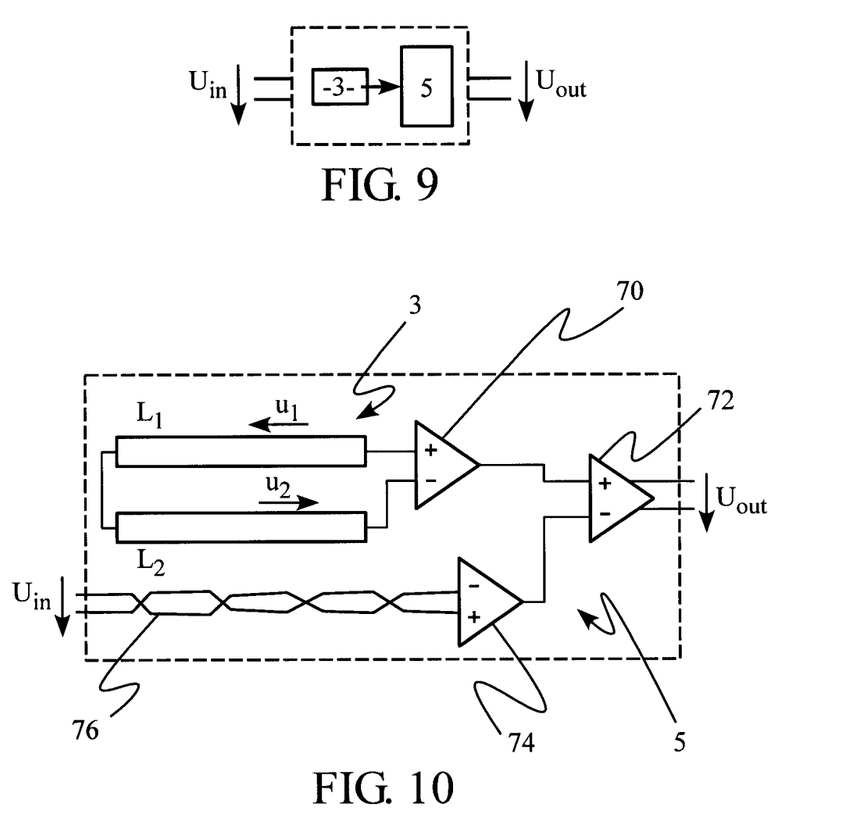
FIG. 9 is a general schematic representation of a Rogowski coil segment according to a second embodiment.
FIG. 10 is an example of an electrical circuit diagram of the Rogowski coil segment of FIG. 9.

FIG. 9 relates to a second embodiment and shows a general representation of a coil segment 3 followed by a signal decoupling circuit 5 in a 4-pole representation, with one input port and one output port.

FIG. 10 shows an embodiment of a coil segment with signal amplification in a symmetrical, differential design.

As shown in FIG. 10, the coil segment 3 includes a first and a second coil, L1 & L2, connected in series and wound such that the induced voltages $u_1$ and $u_2$ of each coil L1 and L2 are added up.

The signal decoupling circuit 5 includes a first 70 operational amplifier, a second 74 operational amplifier, and a fully differential amplifier 72.

One end of the first coil L1 is connected to the non-inverting input of a first operational amplifier 70, having a gain A, and the other end of the second coil is connected to the input of the inverting input of the first operational amplifier 70.

The output of the first operational amplifier 70 is connected to the non-inverting input of a fully differential amplifier 72 sensibly of unity gain.

The outputs of the fully differential amplifier 72 are the outputs of a coil segment 3.

The inverting input of the fully differential amplifier 72 is connected to the output of a second operational amplifier 74 having unity gain.

The non-inverting and inverting inputs of the second operational amplifier 74 are connected via a twisted pair cable or a coaxial cable 76 to the outputs of a preceding coil segment 3.

In this, case, $$U_{out}=U_{in}+A*(u1+u2)$$

Figure 11:
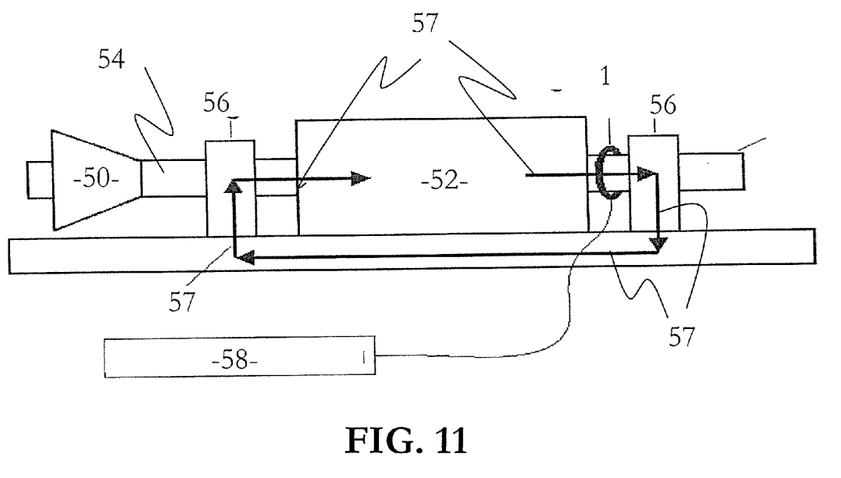
FIG. 11 shows a simplified scheme of a generator of a power plant with a current measuring unit using the Rogowski coil assembly.
Figure 12:
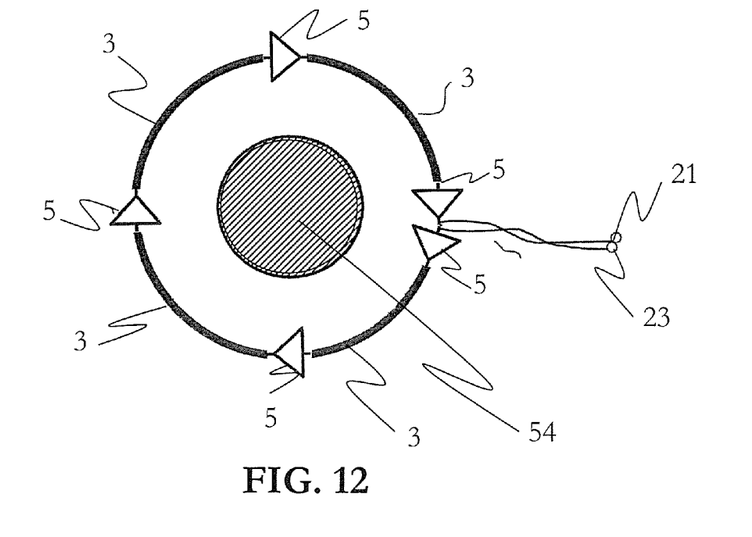
FIG. 12 is a schematic cross sectional view of a Rogowski coil assembly disposed around a shaft of an electrical machine.

FIGS. 11 and 12 show a possible application of such a Rogowski coil assembly.

FIG. 11 shows a simplified scheme of a turbine 50 and generator 52 mounted on the same shaft 54 that can rotate in bearings 56.

As already disclosed in U.S. Pat. No. 7,102,379, detection of sharp spikes from the shaft current may indicate spark erosion on the shaft. In the drawing, the shaft current is represented by arrows 57.

For monitoring and/or analysis of such an electrical machine, a current measurement apparatus 58 including an above-described Rogowski coil assembly 1, bent around the shaft (see FIG. 12, showing schematically four Rogowski coil segments 3 that are assembled together around shaft 54), is used.

It can be understood that the device described herein allow adapting easily the length of a Rogowski coil assembly while having a large bandwidth and a good measurement sensitivity and precision.

While the invention has been described in detail with reference to exemplary embodiments thereof, it will be apparent to one skilled in the art that various changes can be made, and equivalents employed, without departing from the scope of the invention. The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

We claim:

1. A Rogowski coil assembly useful for measurement of high frequency electrical currents comprising:
    (a) at least two coil segments disposed in series, wherein each coil segment includes an input and an output;
    (b) retrospective impedance influence reduction coupling of said at least two coil segments;
    (c) a signal decoupling circuit having an input and an output; and
    (d) a non-magnetic core and a return conductor;
    wherein the at least two coil segments are wound around the non-magnetic core, and the return conductor is led through the non-magnetic core,
    wherein the at least two coil segments are connected to each other in series through the signal decoupling circuit, with the output of one coil segment connected to the input of the signal decoupling circuit and the input of a subsequence coil segment connected to the output of the signal decoupling circuit,
    wherein the signal decoupling circuit comprises an impedance converting electrical component with high input impedance and low output impedance, and
    wherein the impedance converting electrical component comprises an operational amplifier or an electrical difference amplifier with high input impedance and low output impedance.

2. A Rogowski coil assembly according to claim 1, wherein the operational amplifier is mounted as a voltage follower.

3. A Rogowski coil assembly according to claim 1, wherein:
    the impedance converting electrical component comprises an operational amplifier and two resistances in series configured as a voltage divider, the operational amplifier having a noninverting input and the voltage divider having an input;

the operational amplifier and the voltage divider are configured as a non-inverting amplifier; and the output of said one coil segment is connected to the non-inverting input of the operational amplifier and the input of said one coil segment is connected to the input of the voltage divider.

4. A Rogowski coil assembly according to claim 1, wherein the signal decoupling circuit comprises a signal converter having an electrical input signal channel and an electrical output signal channel.

5. A Rogowski coil assembly according to claim 4, wherein the signal converter comprises at least one element from the group consisting of:

an optoelectrical converter having an electrical input signal channel and an electrical output signal channel, a high frequency converter having an electrical input signal channel and an electrical output signal channel, and an A/D-D/A converter.

6. A Rogowski coil assembly according to claim 1, wherein:

at least one coil segment of said at least two coil segments comprises a first coil and a second coil connected in series and wound such that induced voltages of each coil are added;

the signal decoupling circuit comprises a first operational amplifier with a gain A, a second operational amplifier with unity gain, and a fully differential amplifier with unity gain, one end of the first coil being connected to a non-inverting input of the first operational amplifier and an unconnected end of the second coil being connected to an inverting input of the first operational amplifier, an output of the first operational amplifier being connected to a noninverting input of the fully differential amplifier, outputs of said fully differential amplifier being outputs of a coil segment, an inverting input of the fully differential amplifier being connected to an output of the second operational amplifier, and non-inverting and inverting inputs of said second operational amplifier being connected to outputs of a preceding coil segment of said at least two coil segments.

7. A Rogowski coil assembly according to claim 1, further comprising:

a low-pass filter connected between a point between an output of one of said at least two coil segments and an input of the signal decoupling circuit, and said return conductor.

8. A Rogowski coil assembly according to claim 1, wherein the low-pass filter comprises damping resistance.

9. A Rogowski coil assembly according to claim 1, where the non-magnetic core comprises a hollow center and a radially oriented longitudinal slit between the hollow center and an outer periphery of the non-magnetic core.

10. A Rogowski coil assembly according to claim 1, wherein the non-magnetic core comprises built up core segments together having the same total length as the length of the coil segments.

11. A Current measurement apparatus comprising a Rogowski coil assembly according to claim 1.

12. A shaft erosion monitoring device for at least one of monitoring and analysis of electrical machines during operation comprising a current measurement apparatus according to claim 11 configured and arranged to detect shaft currents.

* * * * *

UNITED STATES PATENT AND TRADEMARK OFFICE
CERTIFICATE OF CORRECTION

PATENT NO. : 9,442,139 B2
APPLICATION NO. : 13/767045
DATED : September 13, 2016
INVENTOR(S) : Hobelsberger et al.

Page 1 of 1

It is certified that error appears in the above-identified patent and that said Letters Patent is hereby corrected as shown below:

On the Title Page, in Item (72), under "Inventors", in Column 1, Line 1, delete "Max" and insert -- Maximilian --, therefor.

On the Title Page, in Column 1, below Item (65), insert Item
-- "Related U.S. Application Data
(63) Continuation of application PCT/EP2011/064211, filed on Aug. 18, 2011." --.

Specification

In Column 4, Line 16, delete "the in series" and insert -- the in-series --, therefor.

In Column 4, Line 35, delete "assembly, and" and insert -- assembly, --, therefor.

In Column 7, Line 60, delete "In this, case," and insert -- In this case, --, therefor.

Signed and Sealed this
Sixth Day of December, 2016

Michelle K. Lee
*Director of the United States Patent and Trademark Office*